US009614111B2

United States Patent
Teraji et al.

(10) Patent No.: US 9,614,111 B2
(45) Date of Patent: Apr. 4, 2017

(54) CIGS FILM, AND CIGS SOLAR CELL EMPLOYING THE SAME

(71) Applicant: NITTO DENKO CORPORATION, Ibaraki-shi, Osaka (JP)

(72) Inventors: Seiki Teraji, Ibaraki (JP); Hiroto Nishii, Ibaraki (JP); Taichi Watanabe, Ibaraki (JP); Yusuke Yamamoto, Ibaraki (JP); Kazunori Kawamura, Ibaraki (JP); Takashi Minemoto, Kusatsu (JP); Jakapan Chantana, Kusatsu (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/766,552

(22) PCT Filed: Jan. 24, 2014

(86) PCT No.: PCT/JP2014/051505
§ 371 (c)(1),
(2) Date: Aug. 7, 2015

(87) PCT Pub. No.: WO2014/125898
PCT Pub. Date: Aug. 21, 2014

(65) Prior Publication Data
US 2015/0380589 A1    Dec. 31, 2015

(30) Foreign Application Priority Data

Feb. 12, 2013  (JP) .................................. 2013-024574

(51) Int. Cl.
*H01L 31/00*  (2006.01)
*H01L 31/032*  (2006.01)
(Continued)

(52) U.S. Cl.
CPC ...... *H01L 31/0322* (2013.01); *H01L 21/0251* (2013.01); *H01L 21/02485* (2013.01); (Continued)

(58) Field of Classification Search
CPC ............... H01L 31/065; H01L 31/0322; H01L 31/0323; H01L 31/0749; H01L 21/02568;
(Continued)

(56) References Cited

U.S. PATENT DOCUMENTS 5,356,839 A    10/1994 Tuttle et al.
5,436,204 A    7/1995 Albin et al.
(Continued)

FOREIGN PATENT DOCUMENTS

CN    101506990 A    8/2009
JP    10-135498 A    5/1998
(Continued)

OTHER PUBLICATIONS

International Preliminary Report on Patentability (Form PCT/IB/373) issued in counterpart Internal Application No. PCT/JP2014/051505 dated Aug. 27, 2015, with Form PCT/ISA/237 (8 pages).
(Continued)

*Primary Examiner* — Lindsey Bernier
(74) *Attorney, Agent, or Firm* — Westerman, Hattori, Daniels & Adrian, LLP

(57) ABSTRACT

The present invention provides a CIGS film substantially free from oxidation of a front surface thereof and a CIGS solar cell employing the CIGS film and substantially free from reduction and variation in conversion efficiency. The CIGS film, which is used as a light absorbing layer for the CIGS solar cell, includes: a first region having a Ga/(In+Ga) ratio progressively reduced along its thickness toward a predetermined first thickness position from a back surface of the CIGS film; a second region having a Ga/(In+Ga) ratio
(Continued)

progressively increased along its thickness toward a predetermined second thickness position from the first region; and a third region provided on the second region and having a Ga/(In+Ga) ratio progressively reduced along its thickness toward the front surface of the CIGS film.

4 Claims, 7 Drawing Sheets

(51) Int. Cl.
  *H01L 31/0392* (2006.01)
  *H01L 31/0749* (2012.01)
  *H01L 21/02* (2006.01)
  *H01L 31/065* (2012.01)

(52) U.S. Cl.
  CPC .. *H01L 21/02568* (2013.01); *H01L 31/03923* (2013.01); *H01L 31/03928* (2013.01); *H01L 31/065* (2013.01); *H01L 31/0749* (2013.01); *Y02E 10/50* (2013.01); *Y02E 10/541* (2013.01); *Y02E 10/543* (2013.01)

(58) Field of Classification Search
  CPC ........... H01L 21/0251; H01L 31/03923; H01L 31/03928; Y02E 10/50; Y02E 10/543; Y02E 10/541
  USPC .................. 136/252, 255, 262, 264, 265
  See application file for complete search history.

(56) References Cited

U.S. PATENT DOCUMENTS

| | | | |
|---|---|---|---|
| 5,441,897 A | | 8/1995 | Noufi et al. |
| 5,981,868 A | * | 11/1999 | Kushiya ............. H01L 31/0322 136/255 |
| 7,604,843 B1 | | 10/2009 | Robinson et al. |
| 2006/0207644 A1 | | 9/2006 | Robinson et al. |
| 2010/0096015 A1 | | 4/2010 | Robinson et al. |
| 2011/0083743 A1 | | 4/2011 | Yamamoto |
| 2011/0174363 A1 | * | 7/2011 | Munteanu ......... H01L 21/02425 136/255 |
| 2011/0232762 A1 | | 9/2011 | Murakami |
| 2013/0316490 A1 | * | 11/2013 | Aida ................. H01L 21/02422 438/95 |

FOREIGN PATENT DOCUMENTS

| | | | | |
|---|---|---|---|---|
| JP | 10-513606 A | 12/1998 | | |
| JP | 2007-335792 A | 12/2007 | | |
| JP | 2011-100976 A | 5/2011 | | |
| JP | 2011-222967 A | 11/2011 | | |
| JP | 2013-84664 A | 5/2013 | | |
| LU | WO 2012091170 A1 * | 7/2012 | ....... H01L 21/02422 |

OTHER PUBLICATIONS

International Search Report dated Mar. 4, 2014, issued in counterpart International Application No. PCT/JP2014/051505 (1 page).

Office Action dated Oct. 25, 2016, issued in counterpart Japanese Patent Application No. 2013-024574, with English translation. (8 pages).

Office Action dated Oct. 24, 2016, issued in counterpart Chinese Patent Application No. 201480008053.6, with English translation. (18 pages).

Office Action and Search Report dated Dec. 16, 2016, issued in counterpart Taiwanese Application No. 103103784, with English translation. (7 pages).

* cited by examiner

US 9,614,111 B2

CIGS FILM, AND CIGS SOLAR CELL EMPLOYING THE SAME

TECHNICAL FIELD

The present invention relates to a CIGS film having a Ga/(In+Ga) ratio varying along its thickness, and a CIGS solar cell employing the CIGS film as a light absorbing layer thereof.

BACKGROUND ART

Thin film solar cells typified by amorphous silicon solar cells and compound thin film solar cells allow for significant reduction in material costs and production costs as compared with conventional crystalline silicon solar cells. In recent years, therefore, research and development have been rapidly conducted on these thin film solar cells. Among these thin film solar cells, a CIGS solar cell which is a type of compound thin film solar cell produced by employing Group I, III and VI elements as constituents and including a CIGS film composed of an alloy of copper (Cu), indium (In), gallium (Ga) and selenium (Se) as a light absorbing layer is particularly attractive, because the CIGS solar cell is excellent in sunlight conversion efficiency (hereinafter referred to simply as "conversion efficiency") and is produced without the use of silicon.

As shown in FIG. 8, the CIGS solar cell typically includes a substrate 81, and a rear electrode layer 82, the CIGS film 83, a buffer layer 84 and a transparent electrically-conductive film 85 provided in this order over the substrate 81.

An exemplary method for producing the CIGS film (light absorbing layer) 83 of the CIGS solar cell is a so-called three-step method which is capable of imparting the CIGS film with a higher conversion efficiency. In this method, three steps are performed after the rear electrode layer 82 is formed over a front surface of the substrate 81. In the first step, In, Ga and Se are vapor-deposited on a front surface of the rear electrode layer 82 to form an $(In,Ga)_2Se_3$ film. In the second step, the temperature of the substrate 81 is increased to 550° C., and Cu and Se are further vapor-deposited, whereby a Cu-rich CIGS film intermediate product is formed. At this stage, two phases, i.e., liquid phase $Cu_{(2-x)}Se$ and solid phase CIGS, coexist in the CIGS film intermediate product, whereby crystal grain size is rapidly increased in the presence of $Cu_{(2-x)}Se$. It is known that $Cu_{(2-x)}Se$ has a lower resistance and, therefore, adversely influences solar cell characteristics. In the third step, therefore, In, Ga and Se are further vapor-deposited to reduce the proportion of $Cu_{(2-x)}Se$. Thus, the CIGS film 83 has a composition slightly rich in Group III as a whole. The CIGS film 83 thus formed by the three-step method has greater crystal grain diameters and yet has a thin film crystal structure having a crystallographically higher quality (see, for example, PTL 1).

The CIGS film 83 formed in the aforementioned manner has a V-shaped Ga/(In+Ga) ratio profile (so-called double-graded structure) such that the Ga/(In+Ga) ratio is progressively reduced along its thickness toward a predetermined thickness position 83a (see FIG. 8) from a back surface of the CIGS film 83 (an interface between the CIGS film 83 and the rear electrode layer 82) and is progressively increased toward a front surface of the CIGS film 83 from the predetermined thickness position 83a as shown in FIG. 9. The CIGS solar cell (see FIG. 8) employing the CIGS film 83 as the light absorbing layer has a higher conversion efficiency. The Ga/(In+Ga) ratio is herein defined as follows:

(A) the ratio of a gallium (Ga) atomic number concentration to the sum of an indium (In) atomic number concentration and the gallium (Ga) atomic number concentration.

RELATED ART DOCUMENT

Patent Document

PTL 1: JP-A-HEI10(1998)-513606

SUMMARY

However, some CIGS solar cells having the aforementioned construction still has a significantly lower conversion efficiency with significant variation.

The inventors of the present invention conducted studies to clarify the cause of the aforementioned problem. As a result, the inventors found that the problem is attributable to oxidation of the front surface of the CIGS film 83 (in contact with the buffer layer 84). That is, the CIGS film 83 having the double-graded structure has a Ga/(In+Ga) ratio progressively increased toward the front surface of the CIGS film 83 from the predetermined thickness position 83a, so that Ga is present in a higher proportion in the front surface. Ga is more susceptible to oxidation than In. Therefore, oxidation of Ga is more liable to proceed when the front surface of the CIGS film 83 is exposed to air (oxygen) for a longer period of time. Where the CIGS solar cell is produced by forming the buffer layer 84 and the transparent electrically-conductive film 85 over the front surface of the CIGS film 83 suffering from the oxidation of Ga, the CIGS solar cell has a significantly reduced conversion efficiency with significant variation.

In view of the foregoing, it is an object of the present invention to provide a CIGS film which is substantially free from the oxidation of the front surface thereof, and a CIGS solar cell employing the CIGS film and substantially free from the reduction and the variation in conversion efficiency.

According to a first aspect of the present invention to achieve the aforementioned object, there is provided a CIGS film to be used as a light absorbing layer for a CIGS solar cell, the CIGS film including: a first region having a Ga/(In+Ga) ratio progressively reduced along its thickness toward a predetermined thickness position from a back surface of the CIGS film; a second region provided on the first region and having a Ga/(In+Ga) ratio progressively increased along its thickness toward a front surface of the CIGS film; and a third region provided on the second region and having a Ga/(In+Ga) ratio progressively reduced along its thickness toward the front surface of the CIGS film; the Ga/(In+Ga) ratios each being defined as follows:

(A) the ratio of a gallium (Ga) atomic number concentration to the sum of an indium (In) atomic number concentration and the gallium (Ga) atomic number concentration.

According to a second aspect of the present invention, there is provided a CIGS solar cell, which includes a substrate, and a rear electrode layer, a light absorbing layer, a buffer layer and a transparent electrically-conductive film provided in this order over the substrate, wherein the light absorbing layer is the aforementioned CIGS film, and the CIGS film has a back surface located adjacent to the rear electrode layer.

In the present invention, the atomic number concentrations may be each measured, for example, by means of an energy dispersive fluorescent X-ray analyzer (EX-250 available from Horiba Corporation) or a D-SIMS (dynamic SIMS) evaluation apparatus (available from Ulvac-Phi, Inc.)

In the inventive CIGS film, the Ga/(In+Ga) ratio of the third region located adjacent to the front surface is progressively reduced toward the front surface from the second region provided below the third region. Therefore, oxidation-susceptible Ga is present in a lower proportion in the front surface. Thus, even if the front surface is exposed to air (oxygen) for a longer period of time, the oxidation can be suppressed. Where the CIGS film is used as the light absorbing layer for the CIGS solar cell, the CIGS solar cell is substantially free from the reduction and the variation in conversion efficiency.

Particularly, where the Ga/(In+Ga) ratio in the second region has a peak value of 0.3 to 0.6 and the Ga/(In+Ga) ratio in the third region has a reduction of 0.02 to 0.3, the conversion efficiency of the CIGS solar cell employing the CIGS film as the light absorbing layer can be maintained at a higher level. Further, it is possible to suppress the oxidation in the front surface of the CIGS film while minimizing the variation in conversion efficiency.

Where the third region has a thickness of 30 to 200 nm, it is possible to properly suppress the oxidation in the front surface while suppressing the reduction and the variation in conversion efficiency with proper balance.

The inventive CIGS solar cell employs the inventive CIGS film as the light absorbing layer, and the back surface of the CIGS film is located adjacent to the rear electrode layer. In the inventive CIGS solar cell, the buffer layer is provided over the front surface of the CIGS film substantially free from the oxidation. This effectively suppresses the reduction and the variation in conversion efficiency.

DESCRIPTION OF EMBODIMENTS

Next, an embodiment of the present invention will be described in detail based on the attached drawings.

Figure 1:
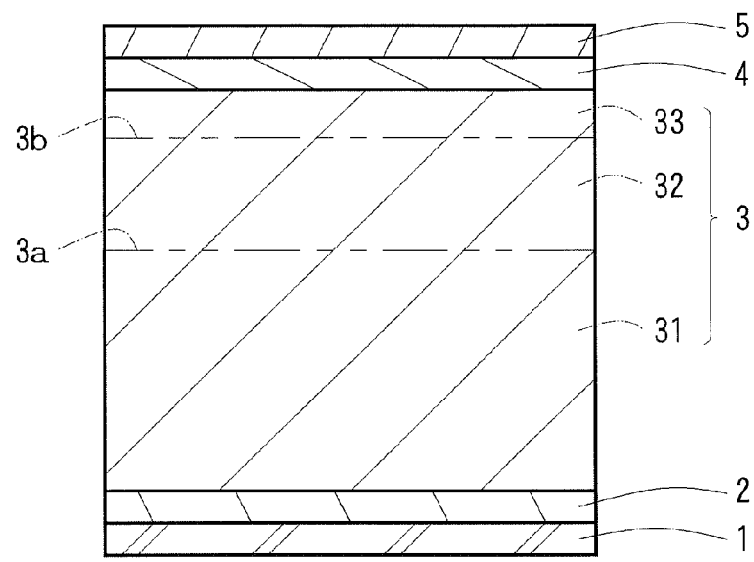
FIG. 1 is a sectional view schematically illustrating a CIGS solar cell according to one embodiment.
Figure 2:
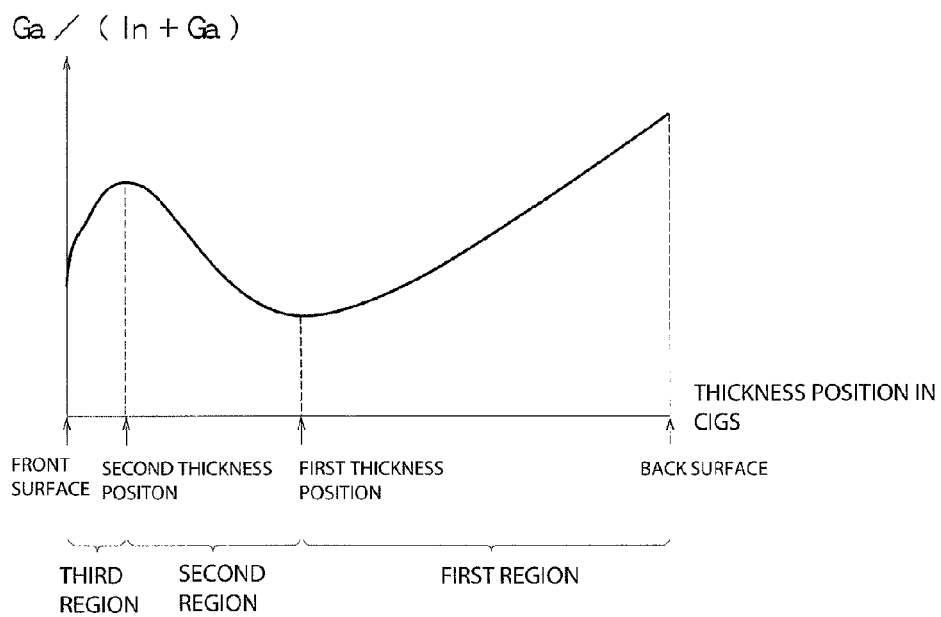
FIG. 2 is a graph schematically showing a variation in Ga/(In+Ga) ratio observed along the thickness of a CIGS film according to the embodiment.

FIG. 1 is a sectional view schematically illustrating a CIGS solar cell according to the embodiment, in which a CIGS film according to the embodiment is employed as a light absorbing layer. The CIGS solar cell according to this embodiment includes a substrate 1, and a rear electrode layer 2, a CIGS film 3, a buffer layer 4 and a transparent electrically-conductive film 5 provided in this order over the substrate 1. As shown in FIG. 2, the Ga/(In+Ga) ratio is progressively reduced along the thickness of the CIGS film 3 toward a predetermined first thickness position 3a (see FIG. 1) in a first region 31 extending from a back surface of the CIGS film 3 located adjacent to the rear electrode layer 2 to the first thickness position 3a. The Ga/(In+Ga) ratio is progressively increased along the thickness of the CIGS film 3 (toward a front surface of the CIGS film 3) in a second region 32 provided on the first region 31 and extending to a second thickness position 3b (see FIG. 1). Further, the Ga/(In+Ga) ratio is progressively reduced along the thickness of the CIGS film 3 (toward the front surface) in a third region 33 provided on the second region 32 and extending to the front surface. Thus, the third region 33 in which oxidation-susceptible Ga is present in a lower proportion is provided adjacent to the front surface of the CIGS film 3, so that the CIGS film 3 is substantially free from the oxidation in the front surface thereof. This is a major feature of the present invention.

The CIGS solar cell may be produced by the following production method.

First, the substrate 1 (see FIG. 3A) is prepared. The substrate 1 serves as a support substrate, and is made of a material capable of enduring a temperature of not lower than 520° C. to withstand heating in the subsequent heating step. Examples of the material include soda lime glass (SLG), stainless steel and titanium. Particularly, ferrite SUS430 is preferred for workability.

Figure 3A:
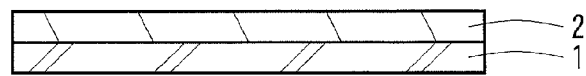
FIGS. 3A to 3D are schematic diagrams for explaining a production method for the solar cell.

Then, as shown in FIG. 3A, the rear electrode layer 2 is formed over a front surface of the substrate 1 by a sputtering method or the like. Exemplary materials for the rear electrode layer 2 include molybdenum, tungsten, chromium and titanium. The rear electrode layer 2 may have a single layer structure or a multilayer structure. The rear electrode layer 2 preferably has a thickness of 100 nm to 1000 nm.

Figure 3B:
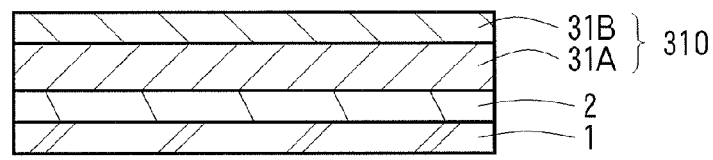
Figure 3C:
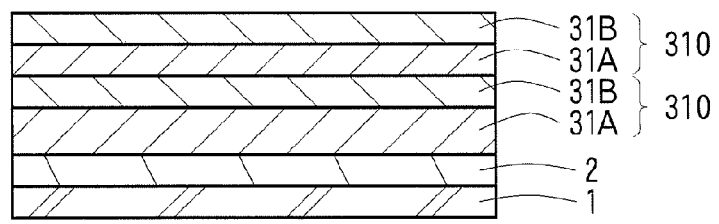
Figure 3D:
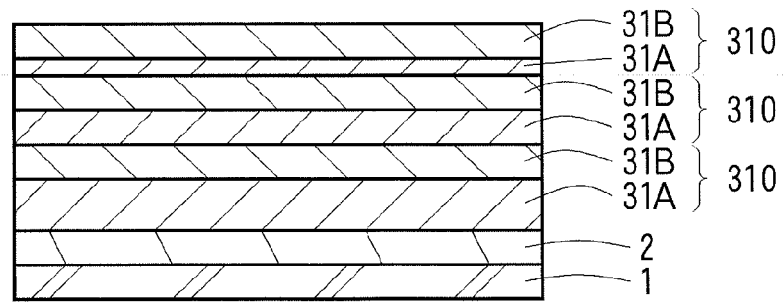

Subsequently, as shown in FIG. 3B, a gallium selenide film 31A is formed over a front surface of the rear electrode layer 2 by a vapor deposition method, and then an indium selenide film 31B is formed on a front surface of the gallium selenide film 31A by a vapor deposition method in order to form the first region 31 of the CIGS film 3 (see FIG. 1) over the front surface of the rear electrode layer 2. In turn, as shown in FIG. 3C, a gallium selenide film 31A is formed on a front surface of the indium selenide film 31B in the same manner as described above by the vapor deposition, and then an indium selenide film 31B is formed on a front surface of the gallium selenide film 31A by the vapor deposition. These steps are repeated to stack one or more stacks 310 (three stacks in FIG. 3D) each including the gallium selenide film 31A provided on the lower side and the indium selenide film 31B provided on the upper side as shown in FIG. 3D.

At this time, the thickness ratio (Y/X) between the thickness (Y) of the gallium selenide film 31A and the thickness (X) of the indium selenide film 31B in each of the stacks 310 is set so that, in the first region 31 being formed, the Ga/(In+Ga) ratio is progressively reduced as the thickness of the first region 31 is increased as described above. In this embodiment, the thickness (X) of the indium selenide film 31B is set constant, and the thickness (Y) of the gallium selenide film 31A is reduced as the stacking is repeated. Thus, the thickness ratio (Y/X) is reduced as the stacking is repeated. The thickness is controlled, for example, by controlling the temperature of an evaporation source such as Ga (i.e., the thickness is increased by increasing the temperature, and reduced by reducing the temperature) or by controlling the diameter of the opening of the evaporation source (i.e., the thickness is increased by increasing the opening diameter, and reduced by reducing the opening diameter). In order to optimize the Ga/(In+Ga) ratio in the first region 31 being formed, the first stack 310 preferably has a thickness ratio (Y/X) of 0.5 to 1.3, and the last stack 310 preferably has a thickness ratio (Y/X) of 0.2 to 0.5 which is smaller than the thickness ratio (Y/X) of the first stack 310.

Figure 4A:
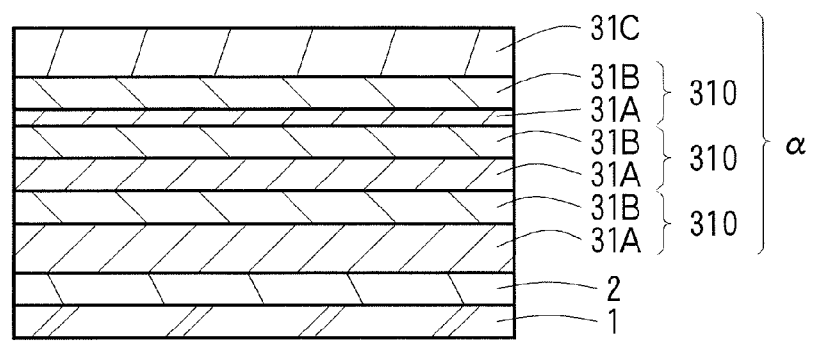
FIGS. 4A and 4B are schematic diagrams following FIGS. 3A to 3D for explaining the production method for the solar cell.

After the last stack 310 is formed, as shown in FIG. 4A, Cu and Se are vapor-deposited on a front surface of the indium selenide film 31B provided on the upper side of the stack 310 for crystal growth, whereby a vapor deposition (copper selenide) layer 31C is formed. Thus, a layered structure α including the stacks 310 and the single vapor-deposition layer 31C is produced. In the step of producing the layered structure α, the substrate 1 is preferably maintained at a retention temperature of 251° C. to 400° C., more preferably 290° C. to 360° C. If the substrate retention temperature is higher than 400° C., diffusion is liable to occur in the vapor deposition layer 31C during the formation of the vapor deposition layer 31C, thereby preventing uniform crystal growth in the subsequent step. In addition, Se is liable to re-evaporate from the stacks 310, thereby impairing the crystal quality.

Figure 4B:
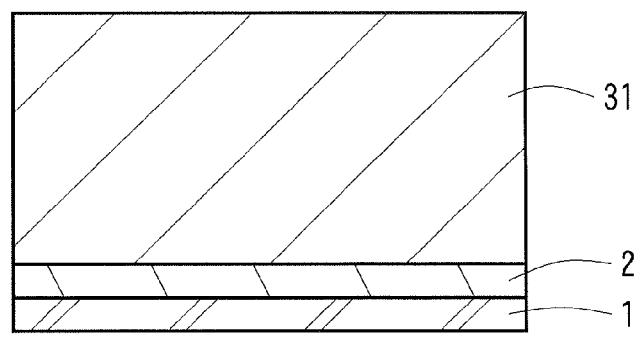

Thereafter, as shown in FIG. 4B, the layered structure α is heated to not lower than 520° C. for crystal growth, whereby the first region 31 of the CIGS film 3 is completed. That is, the heating liquefies the vapor deposition (copper selenide) layer 31C and homogenously diffuses Cu throughout the layered structure α to cause the crystal growth. Therefore, the first region 31 thus formed is thicker than the layered structure α. In the first region 31 thus formed, the Ga/(In+Ga) ratio is progressively reduced along the thickness of the first region 31 from the back surface (see FIG. 2).

Figure 5A:
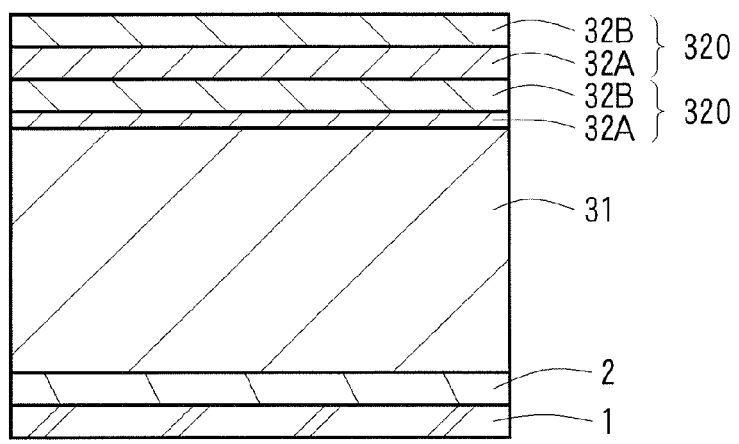
FIGS. 5A and 5B are schematic diagrams following FIGS. 4A and 4B for explaining the production method for the solar cell.

Then, as shown in FIG. 5A, the temperature is maintained at not lower than 520° C., and one or more stacks 320 (two stacks in FIG. 5A) each including a gallium selenide film 32A provided on a lower side and an indium selenide film 32B provided on an upper side are stacked on the first region 31 in the same manner as described above (see FIGS. 3B to 3D) to form the second region 32 of the CIGS film 3 on a front surface of the first region 31.

At this time, the thickness ratio (Y/X) between the thickness (Y) of the gallium selenide film 32A and the thickness (X) of the indium selenide film 32B in each of the stacks 320 is set so that, in the second region 32 being formed, the Ga/(In+Ga) ratio is progressively increased toward the front surface from the first region 31 as described above. In this embodiment, the thickness (X) of the indium selenide film 32B is set constant, and the thickness (Y) of the gallium selenide film 32A is increased as the stacking is repeated. Thus, the thickness ratio (Y/X) is increased as the stacking is repeated. In order to optimize the Ga/(In+Ga) ratio in the second region 32 being formed, the first stack 320 preferably has a thickness ratio (Y/X) of 0.2 to 0.5, and the last stack 320 preferably has a thickness ratio (Y/X) of 0.5 to 1.3 which is greater than the thickness ratio (Y/X) of the first stack 320.

Figure 5B:
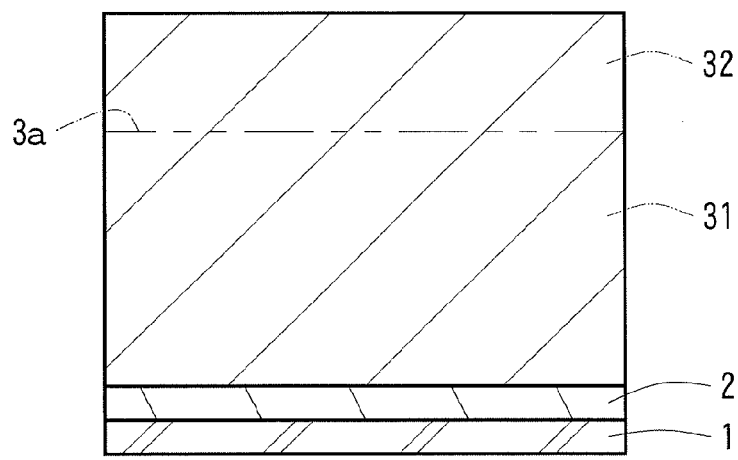

In this step, as described above, the formation of the gallium selenide film 32A and the indium selenide film 32B is achieved by the vapor deposition with the temperature maintained at not lower than 520° C., so that the crystal growth occurs in these films 32A, 32B upon the formation of the films 32A, 32B by the vapor deposition. Therefore, the second region 32 thus formed has a thickness greater than the total thickness of the films 32A, 32B. In this manner, the second region 32 is formed as shown in FIG. 5B. In the second region 32, the Ga/(In+Ga) ratio is progressively increased toward the front surface of the CIGS film 3 from the first region 31 (see FIG. 2). The Ga/(In+Ga) ratio preferably has a peak value of 0.3 to 0.6 so that the conversion efficiency of the produced CIGS solar cell can be maintained at a higher level with smaller variation.

Figure 6A:
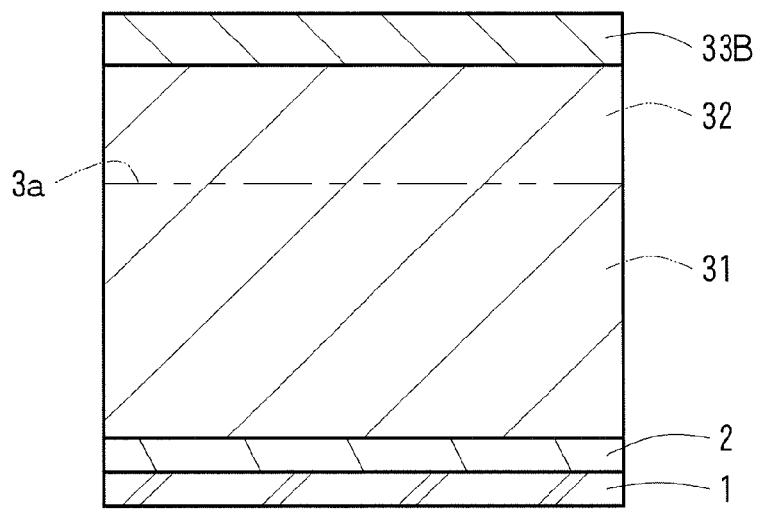
FIGS. 6A and 6B are schematic diagrams following FIGS. 5A and 5B for explaining the production method for the solar cell.
Figure 6B:
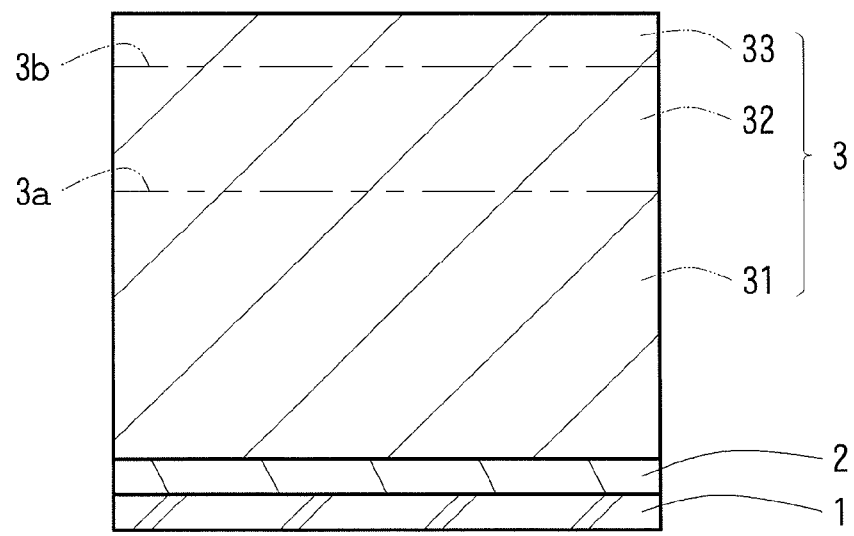

Subsequently, as shown in FIG. 6A, the temperature is maintained at not lower than 520° C., and an indium selenide film 33B is formed on the second region 32 in the same manner as described above by the vapor deposition to form the third region 33 of the CIGS film 3 (see FIG. 1) on the front surface of the second region 32. Since the formation of the indium selenide film 33B is achieved by the vapor deposition with the temperature maintained at not lower than 520° C. in this step, as described above, the crystal growth occurs in the indium selenide film 33B upon the formation of the indium selenide film 33B by the vapor deposition. Therefore, the third region 33 thus formed has a greater thickness than the indium selenide film 33B. In this manner, the formation of the CIGS film 3 including the first to third regions 31, 32 and 33 is completed as shown in FIG. 6B by the formation of the third region 33.

Since the formation of the third region 33 does not involve the formation of the gallium-containing film, the Ga/(In+Ga) ratio is progressively reduced toward the front surface of the CIGS film 3 from the second region 32 (see FIG. 2). The reduction in Ga/(In+Ga) ratio is preferably 0.02 to 0.3 in order to maintain the conversion efficiency of the produced CIGS solar cell at a higher level with smaller variation and to suppress the oxidation in the front surface of the CIGS film 3.

The third region 33 preferably has a thickness of 30 to 200 nm so as to properly suppress the oxidation in the front surface while suppressing the reduction and the variation in conversion efficiency with proper balance.

The composition ratio of Cu, In and Ga of the CIGS film 3 preferably satisfies an expression of 0.70<Cu/(In+Ga) <0.95 (molar ratio). In this case, $Cu_{(2-x)}Se$ is prevented from being excessively incorporated into the CIGS film 3. In addition, the CIGS film 3 is slightly Cu-deficient as a whole. The ratio of Ga and In, which are the same group elements, is preferably 0.10<Ga/(In+Ga)<0.40.

The CIGS film 3 preferably has a thickness of 1.0 to 3.0 μm, more preferably 1.5 to 2.5 μm. If the thickness is excessively small, the CIGS film 3 to be used as the light absorbing layer has a reduced light absorption amount, so that the resulting device is liable to have a poorer performance. If the thickness is excessively great, on the other hand, a longer period is required for the formation of the film, resulting in lower productivity.

Figure 7A:
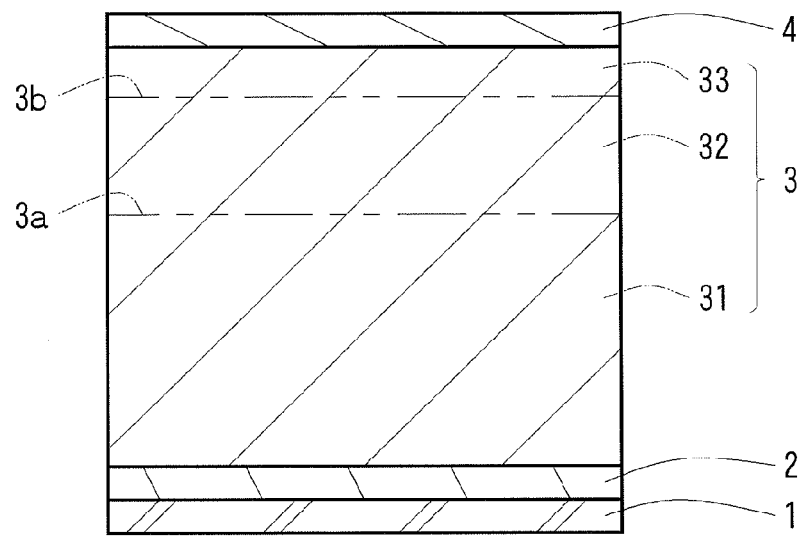
FIGS. 7A and 7B are schematic diagrams following FIGS. 6A and 6B for explaining the production method for the solar cell.

Then, as shown in FIG. 7A, the buffer layer 4 is formed over the front surface of the CIGS film 3. The buffer layer 4 may have a single layer structure such as of ZnMgO or Zn(O,S), or may have a multilayer structure including a CdS layer and a ZnO layer. These layers may be each formed by a proper method. For example, the CdS layer may be formed by a chemical bath deposition method, and the ZnO layer may be formed by a sputtering method. The buffer layer 4 is preferably made of a higher-resistance n-type semiconductor so as to form a pn junction with the CIGS film 3. The buffer layer 4 preferably has a thickness of 30 to 200 nm whether it has the single layer structure or the multilayer structure. Where the buffer layer 4 includes plural types of layers stacked one on another, the pn junction can be more advantageously formed with respect to the CIGS film 3. If the pn junction can be properly formed, the buffer layer 4 is not necessarily required to have the multilayer structure.

Figure 7B:
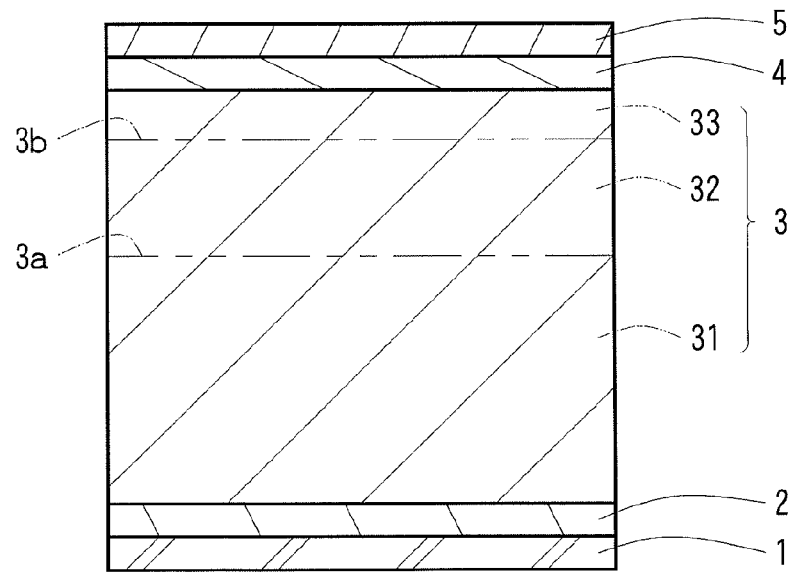
Figure 8:
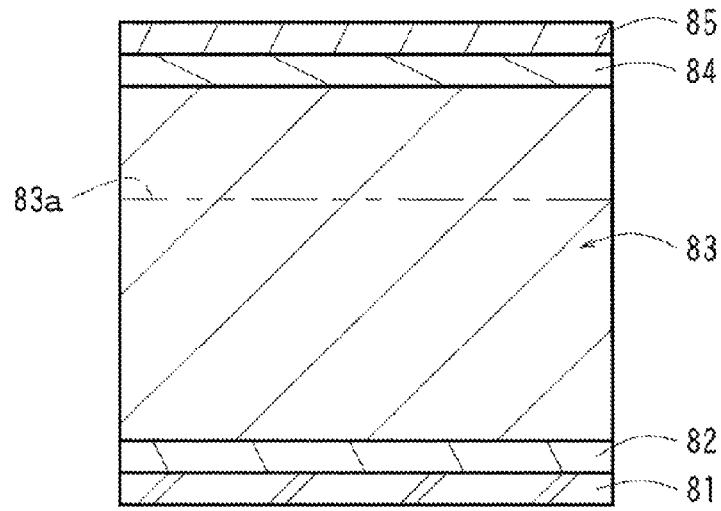
FIG. 8 is a sectional view schematically illustrating a conventional CIGS solar cell.
Figure 9:
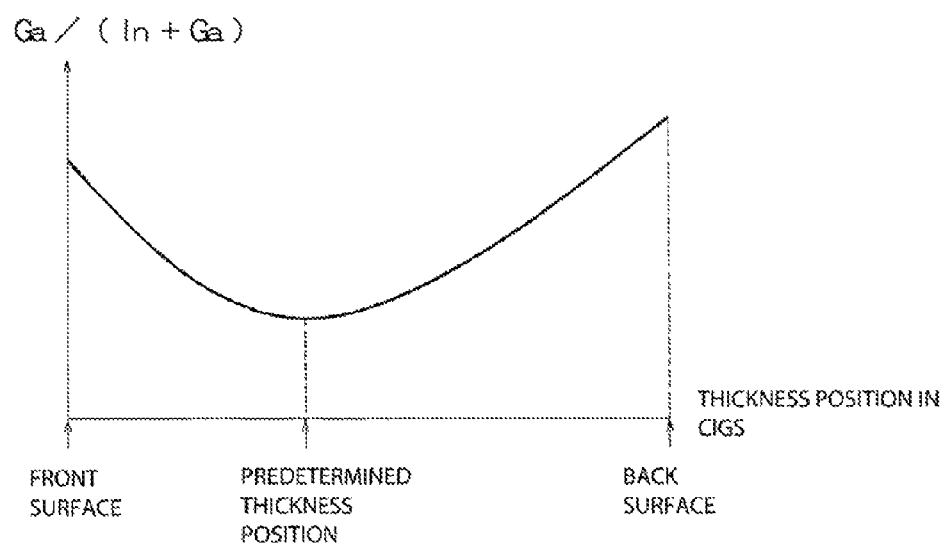
FIG. 9 is a graph schematically showing a variation in Ga/(In+Ga) ratio observed along the thickness of a conventional CIGS film.

Subsequently, as shown in FIG. 7B, the transparent electrically-conductive film 5 is formed over the front surface of the buffer layer 4 by a sputtering method or the like. Exemplary materials for the transparent electrically-conductive film 5 include indium tin oxide (ITO), indium zinc oxide (IZO) and aluminum zinc oxide (Al:ZnO). The transparent electrically-conductive film 5 preferably has a thickness of 100 to 300 nm.

Thus, the CIGS solar cell is produced in which the rear electrode layer 2, the CIGS film 3, the buffer layer 4 and the transparent electrically-conductive film 5 are stacked in this order over the substrate 1.

In the aforementioned CIGS solar cell production method, the third region 33 containing oxidation-susceptible Ga in a lower proportion is formed adjacent to the front surface of the CIGS film 3. Therefore, the CIGS film 3 is substantially free from the oxidation in the front surface thereof. Further, the CIGS solar cell produced by employing the CIGS film 3 effectively suppresses the reduction and the variation in conversion efficiency.

As described above, the third region 33 containing oxidation-susceptible Ga in a lower proportion is provided adjacent to the front surface of the CIGS film 3. Even if a longer period is required before the formation of the buffer layer 4 over the front surface of the CIGS film 3 after the formation of the third region 33 (after the formation of the CIGS film 3) and, therefore, the front surface of the third region 33 (the front surface of the CIGS film 3) is exposed to air (oxygen) for a longer period of time, the oxidation of the front surface can be suppressed. That is, even if a period between the formation of the third region 33 (the formation of the CIGS film 3) and the formation of the buffer layer 4 is longer, the reduction and the variation in the conversion efficiency of the produced CIGS solar cell are not significantly influenced. This makes the CIGS solar cell production method more flexible to optimize the production control.

In the embodiment described above, the CIGS solar cell is configured so that the rear electrode layer 2, the CIGS film 3, the buffer layer 4 and the transparent electrically-conductive film 5 are stacked in this order in contact with each other over the substrate 1 but, as required, other layers may be provided between adjacent constituent layers otherwise provided in contact with each other, on the back surface of the substrate 1 and/or on the front surface of the transparent electrically-conductive film 5.

In the embodiment described above, the gallium selenide film 31A, 32A is provided on the lower side and the indium selenide film 31B, 32B is provided on the upper side in each of the stacks 310 provided one on another to form the first region 31 of the CIGS film 3 and in each of the stacks 320 provided one on another to form the second region 32 of the CIGS film 3, but these layers may be stacked in a reverse order (the indium selenide film 31B, 32B may be provided on the lower side, and the gallium selenide film 31A, 32A may be provided on the upper side).

Next, inventive examples will be described in conjunction with a conventional example. It should be understood that the present invention be not limited to these inventive examples.

EXAMPLES

Example 1

<Preparation of Substrate and Formation of Rear Electrode Layer>

A CIGS solar cell was produced in the same manner as in the aforementioned embodiment. More specifically, a substrate of soda lime glass (30 mm×30 mm×0.55 mm (thickness)) was prepared, and a rear electrode layer of molybdenum (having a thickness of 500 nm) was formed over a front surface of the substrate by a sputtering method.

<Formation of First Region>

Then, a gallium selenide film (having a thickness of 130 nm) was formed over a front surface of the rear electrode layer by means of a vapor deposition apparatus while the substrate was maintained at 330° C. Thereafter, an indium selenide film (having a thickness of 330 nm) was formed on a front surface of the gallium selenide film. Subsequently, Cu and Se were vapor-deposited on a front surface of the indium selenide film, whereby a vapor deposition layer of copper selenide (having a thickness of 1400 nm) was formed. In this manner, a stack including the gallium selenide film, the indium selenide film and the copper selenide layer (vapor deposition layer) was formed. Thereafter, the resulting substrate was heated to be maintained at a substrate retention temperature of 550° C. for 5 minutes while a very small amount of Se vapor was supplied to the stack. Thus, the stack experienced crystal growth, whereby a first region was formed.

<Formation of Second Region>

Subsequently, a gallium selenide film was formed on a front surface of the first region in the same manner as described above by maintaining the substrate at 550° C. while supplying a very small amount of Se gas. Thereafter, an indium selenide film was formed on a front surface of the gallium selenide film. At this time, the gallium selenide film had a thickness of 30 nm, and the indium selenide film had a thickness of 80 nm when the substrate temperature reached 330° C.

<Formation of Third Region>

Then, a single indium selenide film (having a thickness of 10 nm) was formed on a front surface of the second region in the same manner as described above through vapor deposition by maintaining the substrate at 550° C. while supplying a very small amount of Se gas. Thus, a third region was formed. In the formation of the third region, a gallium-containing film was not formed. Therefore, the Ga/(In+Ga) ratio was progressively reduced toward the front surface from the second region. Thus, a CIGS film (having a thickness of 2.0 μm) including the first to third regions was formed.

Example 2

A CIGS film was formed in substantially the same manner as in Example 1, except that the indium selenide film was formed as having a thickness of 20 nm by vapor deposition in the formation of the third region of Example 1.

Example 3

A CIGS film was formed in substantially the same manner as in Example 1, except that the indium selenide film was formed as having a thickness of 25 nm by vapor deposition in the formation of the third region of Example 1.

Example 4

A CIGS film was formed in substantially the same manner as in Example 1, except that the gallium selenide film was formed as having a thickness of 25 nm and the indium selenide film was formed as having a thickness of 85 nm by vapor deposition when the substrate was maintained at 330° C. in the formation of the second region of Example 1.

Conventional Example

A CIGS film was formed in substantially the same manner as in Example 1, except that the conventional three-step method was employed. More specifically, a rear electrode layer was formed over the front surface of the substrate in the same manner as in Example 1. Then, In, Ga and Se were simultaneously vapor-deposited with the substrate maintained at a substrate retention temperature of 350° C., whereby a layer of In, Ga and Se was formed. While the substrate was heated to be maintained at a substrate retention temperature of 550° C., Cu and Se were vapor-deposited on the layer of In, Ga and Se, and allowed for crystal growth. Thus, a CIGS film intermediate product was obtained. Further, In, Ga and Se were simultaneously vapor-deposited on the CIGS film intermediate product by maintaining the substrate at a substrate retention temperature of 550° C. while supplying a very small amount of Se vapor to the CIGS film intermediate product. Thus, a CIGS film (having a thickness of 2.0 μm) was formed.

<Formation of Buffer Layer and Transparent Electrode Layer>

For each of Examples 1 to 4 and Conventional Example, two CIGS films were prepared. Within two hours after the formation of one of the two CIGS films (Within two hours during which one of the CIGS films was exposed to air), a CdS layer (having a thickness of 50 nm) was formed on a front surface of the CIGS film by a chemical bath deposition method, and then a ZnO layer (having a thickness of 70 nm) was formed on a front surface of the CdS layer by a sputtering method. Thus, a buffer layer including the CdS layer and the ZnO layer was formed. In turn, a transparent electrode layer of ITO (having a thickness of 200 nm) was formed over a front surface of the buffer layer by a sputtering method. Thus, a CIGS solar cell was produced. The other CIGS film was exposed to air for 24 hours after the formation thereof, and a buffer layer and a transparent electrode layer were formed over a front surface of the CIGS film in the same manner as described above. Thus, another CIGS solar cell was produced.

[Measurement of Conversion Efficiency]

For each of Examples 1 to 4 and Conventional Example, the conversion efficiency of the CIGS solar cell formed with the buffer layer within two hours after the formation of the CIGS film and the conversion efficiency of the CIGS solar cell formed with the buffer layer after a lapse of 24 hours from the formation of the CIGS film were each measured by applying artificial sunlight (AM1.5) to an area over the front surface of the CIGS solar cell by means of a solar simulator (CELL TESTER YSS150 available from Yamashita Denso Corporation). The results are shown below in Table 1.

[Measurement of Ga/(In+Ga) Ratio]

For each of Examples 1 to 4 and Conventional Example, the Ga/(In+Ga) ratio of the CIGS film was measured along the thickness of the film by means of a dynamic SIMS evaluation apparatus (Ulvac-Phi, Inc.) Then, the peak value of the Ga/(In+Ga) ratio in the second region, the depth of a peak value portion of the CIGS film as measured from the front surface of the CIGS film (the thickness of the third region) and a reduction in Ga/(In+Ga) ratio in the third region are shown below in Table 1.

TABLE 1

| | Example | | | | Conventional Example |
|---|---|---|---|---|---|
| | 1 | 2 | 3 | 4 | |
| Peak value of Ga/(In + Ga) ratio | 0.45 | 0.44 | 0.44 | 0.37 | 0.37 |
| Depth (nm) of peak value portion from front surface (thickness of third region) | 100 | 200 | 300 | 200 | 0 |
| Reduction in Ga/(In + Ga) ratio | 0.05 | 0.1 | 0.2 | 0.1 | 0 |
| Conversion efficiency (%) | | | | | |
| Within 2 hours | 15.7 | 15.6 | 15.3 | 14.1 | 13.7 |
| After 24 hours | 15.4 | 15.4 | 15.2 | 13.9 | 12.9 |

The results shown in Table 1 indicate that the CIGS solar cells of Examples 1 to 4 each had a higher conversion efficiency than the CIGS solar cell of Conventional Example and, even where the CIGS films were exposed to air for a longer period time, the conversion efficiencies were not significantly reduced in Examples 1 to 4 as compared with Conventional Example. This is because the front surfaces of the CIGS films of Examples 1 to 4 were less susceptible to oxidation than the front surface of the CIGS film of Conventional Example even when being exposed to air. This is attributable to the fact that the CIGS films of Examples 1 to 4 each had the third region in which oxidation-susceptible Ga was present in a lower proportion, while the CIGS film of Conventional Example had no such region and hence had a higher Ga proportion in the front surface.

While specific forms of the embodiment of the present invention have been shown in the aforementioned inventive examples, the inventive examples are merely illustrative of the invention but not limitative of the invention. It is contemplated that various modifications apparent to those skilled in the art could be made within the scope of the invention.

The inventive CIGS film is usable to suppress the oxidation of the front surface thereof, and the inventive CIGS solar cell is usable to suppress the reduction and the variation in conversion efficiency.

What is claimed is:

1. A copper indium gallium selenide (CIGS) film to be used as a light absorbing layer for a CIGS solar cell, the CIGS film comprising:
    a first region having a Ga/(In+Ga) ratio progressively reduced along its thickness toward a predetermined thickness position from a back surface of the CIGS film;
    a second region provided on the first region and having a Ga/(In+Ga) ratio progressively increased along its thickness toward a front surface of the CIGS film; and
    a third region provided on the second region and having a Ga/(In+Ga) ratio progressively reduced along its thickness toward the front surface of the CIGS film;
    wherein the Ga/(In+Ga) ratios are each defined as a ratio of a gallium (Ga) atomic number concentration to a sum of an indium (In) atomic number concentration and the gallium (Ga) atomic number concentration,
    wherein the first region, the second region and the third region are provided on the back surface in that order, wherein the first region extends continuously from the back surface to the second region, wherein the second region extends continuously from the first region to the third region, wherein the third region extends continuously from the second region to the front surface, wherein the Ga/(In+Ga) ratio in the second region has a peak value of 0.3 to 0.6, and wherein the Ga/(In+Ga) ratio in the third region has a reduction of 0.02 to 0.3.

2. A copper indium gallium selenide (CIGS) film, comprising:
a first region having a Ga/(In+Ga) ratio progressively reduced along its thickness toward a predetermined thickness position from a back surface of the CIGS film;
a second region provided on the first region and having a Ga/(In+Ga) ratio progressively increased along its thickness toward a front surface of the CIGS film; and
a third region provided on the second region and having a Ga/(In+Ga) ratio progressively reduced along its thickness toward the front surface of the CIGS film;
wherein the Ga/(In+Ga) ratios are each defined as a ratio of a gallium (Ga) atomic number concentration to a sum of an indium (In) atomic number concentration and the gallium (Ga) atomic number concentration,
wherein the first region, the second region and the third region are provided on the back surface in that order,
wherein the first region extends continuously from the back surface to the second region,
wherein the second region extends continuously from the first region to the third region,
wherein the third region extends continuously from the second region to the front surface, and
wherein the third region has a thickness of 30 to 200 nm.

3. A copper indium gallium selenide (CIGS) solar cell comprising:
a substrate; and
a rear electrode, a light absorbing layer, a buffer layer and a transparent electrically-conductive film provided in this order over the substrate;
wherein the light absorbing layer is the CIGS film according to claim 1, and
wherein the CIGS film has a back surface located adjacent to the rear electrode.

4. A copper indium gallium selenide (CIGS) solar cell comprising:
a substrate; and
a rear electrode, a light absorbing layer, a buffer layer and a transparent electrically-conductive film provided in this order over the substrate;
wherein the light absorbing layer is the CIGS film according to claim 2, and
wherein the CIGS film has a back surface located adjacent to the rear electrode.

\* \* \* \* \*